US006927339B2

(12) United States Patent
Murr et al.

(10) Patent No.: US 6,927,339 B2
(45) Date of Patent: Aug. 9, 2005

(54) COVER FOR ELECTRONIC COMPONENTS AND METHOD OF USING SAME DURING COMPONENT ASSEMBLY

(75) Inventors: Keith McQuilkin Murr, Etters, PA (US); Michael Sullivan Resner, Etters, PA (US); Alexander Matthews, Middletown, PA (US); Robert Alan Kirker, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/056,615

(22) Filed: Jan. 23, 2002

(65) Prior Publication Data

US 2003/0136575 A1 Jul. 24, 2003

(51) Int. Cl.[7] ................................................ H02G 3/14
(52) U.S. Cl. ...................................................... 174/66
(58) Field of Search .......................... 174/66; 220/241; 33/528, DIG. 10

(56) References Cited

U.S. PATENT DOCUMENTS

| | | | |
|---|---|---|---|
| 4,396,245 A | | 8/1983 | Lane ............................ 339/38 |
| 4,512,619 A | * | 4/1985 | Dechelette ................... 439/276 |
| 4,541,538 A | * | 9/1985 | Swetnam ..................... 220/3.8 |
| 4,795,354 A | * | 1/1989 | Owen .......................... 439/137 |
| 5,168,995 A | * | 12/1992 | German ....................... 206/719 |
| 5,195,901 A | * | 3/1993 | Correnti ...................... 439/147 |
| 5,242,311 A | | 9/1993 | Seong .......................... 439/135 |
| 5,249,977 A | | 10/1993 | Tanaka et al. ............... 439/135 |
| 5,277,601 A | | 1/1994 | Miyazawa ................... 439/135 |
| 5,361,492 A | * | 11/1994 | Miyazawa .................... 29/879 |
| 5,383,797 A | | 1/1995 | Seong et al. ................. 439/476 |
| 5,526,952 A | * | 6/1996 | Green ......................... 220/3.8 |

* cited by examiner

Primary Examiner—Dean A. Reichard
Assistant Examiner—Anton Harris

(57) ABSTRACT

A cover connectable to an electric component is provided for assisting a tool in assembling the electrical component to another structure. The cover includes a body section configured to form a vacuum seal with a tool and a component retention member connected to the body section for releasably securing the body section to an electrical component. The component retention member may include a release arm normally biased toward an electrical component and deflectable away from an electrical component. The component retention member may further include a catch surface configured to be secured to a bottom of an electric component to retain the body section on an electric component. The component retention member may also include a stop beam that extends from an end of the body section at an acute angle to the top surface and is configured maintain an electrical component a desired distance from the body section.

14 Claims, 6 Drawing Sheets

COVER FOR ELECTRONIC COMPONENTS AND METHOD OF USING SAME DURING COMPONENT ASSEMBLY

BACKGROUND OF THE INVENTION

Certain embodiments of the present invention generally relate to a cover for transporting and protecting electronic components. More particularly, certain embodiments of the present invention relate to a removable cover securable to a socket for transporting the socket during assembly to a motherboard where the socket is soldered to the motherboard.

Electronic sockets are small, fragile devices including hundreds or thousands of metal pins secured within a body. Electronic sockets may easily be damaged or contaminated when handled, manipulated, or transported. Airborne dust and debris also pose a threat to the integrity of sockets. Manufacturers of electronic circuits often buy sockets configured to be soldered to motherboards. A motherboard is a printed circuit board with an interconnecting assembly to which other electronic components may be connected. Because the sockets are so sensitive, the sockets are difficult to transport and position on a motherboard by hand. Therefore, manufacturers prefer to use tools to transport and position sockets. However, even using machines to handle sockets does not eliminate the risk of damaging the socket.

In order to address the problems of handling and transporting an electronic socket, some socket cover devices have been proposed to both protect a socket and facilitate transportation of a socket. For example, a Mylar tape or film has been used as a socket cover by applying the tape to the top of a socket, covering the pins and body. The tape protects the socket from airborne contaminants and contact with any other entities. The tape also allows for the socket to be transported. An automated socket manipulation tool may be used to carry and move the socket and tape cover so as to position the socket onto a motherboard. The vacuum tool attaches to the socket by forming a vacuum seal with the tape cover which is, in turn, adhered to the socket. Once the socket is soldered to the motherboard, the tape is then removed from the socket.

The Mylar tape cover suffers from several drawbacks. First, the tape does not provide a rigid surface. Because the tape is extremely thin and pliable, the tape may sag and expose the socket pins or easily be indented or punctured so as to cause damage to the socket pins. Also, the pliable nature of the tape prevents the tape from forming a strong vacuum seal with the socket manipulation tool as air seeps through indentations and punctures in the tape. Therefore, the use of a tape cover increases the risk that the vacuum between the tape and a socket manipulation tool could be interrupted during transportation, causing the socket to fall from the tool.

Secondly, the tape is difficult to remove from the socket. It is time consuming to loosen a corner or side of the tape from the surface of the socket and then grip the corner or side of the tape for removal. The removal process is inconvenient and causes the socket to be manipulated in various directions. The force of the manipulations may damage the socket itself or the soldered joints that connects the socket to the motherboard. The tape also requires a significant amount of force be applied before it can be removed from the surface of the socket. The force used to remove the tape may damage the socket or the solder connection between the socket and the motherboard.

Finally, the adhesive on the tape may leave a residue on the socket. The residue may retain passing airborne contaminants, cause the sockets to be sticky, or seep into the sockets and contaminate or damage the socket pins.

In addition to tape, a hardcover has been proposed. The cover is H-shaped and is snappably connected to a socket. The H-shaped cover comprises two long thin rectangular covers connected to each other by a thin rectangular bar. The entire H-shaped cover is molded as one piece. The H-shaped cover includes an underside that comprises grooves. The H-shaped cover is built to conform to a particular electronic component having ridges in its top side. The H-shaped cover may be positioned over the electronic component so that the grooves may be "snapped" onto the ridges of the electronic component thus connecting the electronic component to the H-shaped cover. Once the H-shaped cover is snapped on to the electronic component, the H-shaped cover may be used to transport the electronic component. The H-shaped cover may be removed from the electronic component by pulling on the H-shaped cover until the grooves disengage from the ridges and the H-shaped cover thus "snaps" off of the electronic component.

However, the H-shaped cover contains drawbacks as well. For example, the H-shaped cover is extremely small and the H-shaped cover cannot be effectively molded in a larger size. Therefore, the H-shaped cover may only be used with electronic components of a similar small size. Electronic components that are larger require a larger cover other than an H-shaped cover. Secondly, removing the H-shaped cover requires a significant amount of force to disengage the ridges of the electronic component from the grooves of the H-shaped cover. The force needed to remove the H-shaped cover may damage the electronic component or anything attached to the electronic component.

Thus a need has long existed for an electronic component cover that is rigid and that may be secured to and removed from an electronic component without damaging the electronic component.

BRIEF SUMMARY OF THE INVENTION

In accordance with at least one embodiment, a cover connectable to an electronic component is provided for assisting in automated assembly of the electronic component to another structure. The cover includes a body section having a top surface configured to form a vacuum seal with a tool and a component retention member connected to the body section for releasably securing the body section to an electronic component. The component retention member includes a release arm normally biased toward an electronic component positioned under the body of the cover. The release arm is deflectable in a second direction opposite to, and away from, an electronic component positioned under the body of the cover in order to release an electronic component. The release arm is oriented at a retention angle to, and extending downward from, the top surface. The component retention member includes a lever extending upward from the top surface. The component retention member also includes a catch surface configured to be secured to a bottom of an electronic component to retain the body section on the electric component. The component release member may include a release arm that is formed with and bent downward from the body section. The release arm has a lower ledge bent inward to hold an electronic component when the release arm is in a normally biased position. The release arm extending in a direction generally perpendicular to the body section and normally, in an unbiased position, forms an angle approximately ninety degrees with the top surface. The release arm is deflectable to an obtuse angle with respect to the body section to release the electronic component.

Optionally, the cover may include a stop beam that extends from an end of the body section at an acute angle close to 90 degrees to the top surface. The stop beam is configured to engage an electrical component under the body section and hold an electrical component a desired distance from the body section. The body section may be injection molded with opposite ends molded integral with end walls of the component retention member. The end walls extend in a direction transverse to a plane containing the top surface. The end walls extend laterally along opposite ends of the body section.

Optionally, the component retention member may include a release beam oriented parallel to a plane containing the body section. The release beam extends laterally along an end of the body section. The component retention member may be formed integral with an end of the body section. The top surface is rigid and planar to facilitate the formation of a vacuum seal. The cover includes an end flange that extends away from a peripheral edge of the body section. The end flange is configured to prevent the movement in at least one direction of an upper end of an electrical component parallel to the top surface.

The foregoing summary, as well as the following detailed description of the preferred embodiments of the present invention, will be better understood when read in conjunction with the appended drawings. It should be understood, however, that the present invention is not limited to the arrangements and instrumentality shown in the attached drawings.

DETAILED DESCRIPTION OF THE INVENTION

Figure 1:
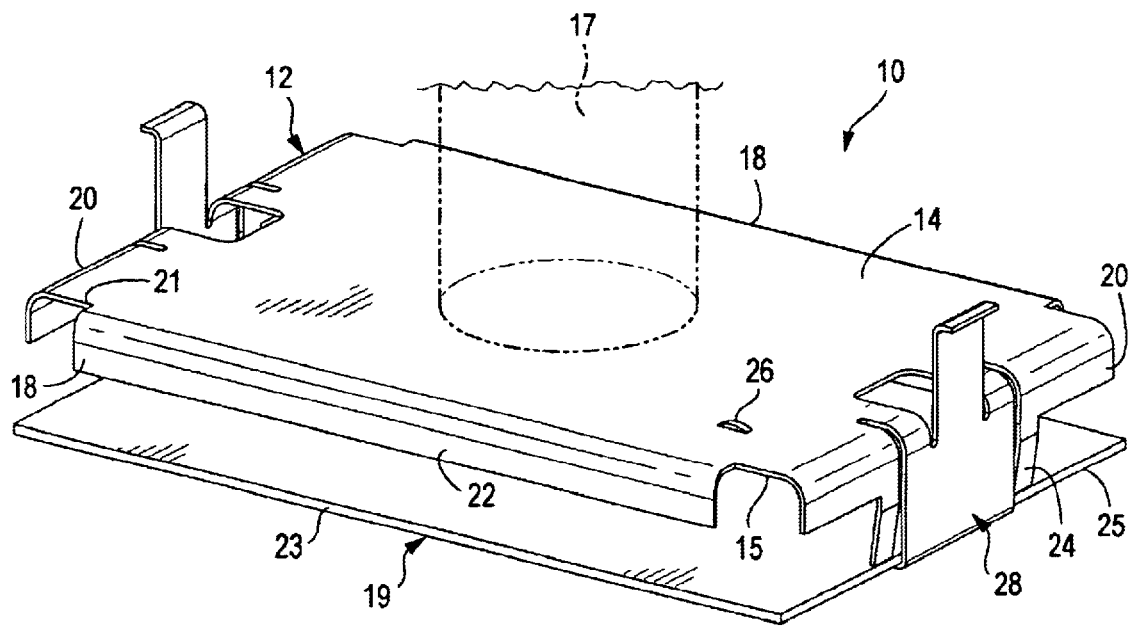
FIG. 1 illustrates an isometric view of an electronic component cover formed in accordance with an embodiment of the present invention.

FIG. 1 illustrates an isometric view of an electronic component cover 10 formed in accordance with an embodiment of the present invention. The cover 10 includes a body 12 that is generally of a uniform rectangular planar shape. The body 12 includes a top surface 14 and a bottom surface 15. The body 12 has lateral side edges 18 and end edges 20. The body 12 is formed of a rigid material to enable and facilitate the formation of a vacuum seal between a socket manipulating tool (generally denoted by dashed lines 17) and the top surface 14. Optionally, only the portion of the top surface 14 adapted to engage the tool 17 may be planar, while the remainder of the top surface 14 may be contoured. The cover 10 may be stamped and formed from a single sheet of material, such as a metal sheet and the like. The overall size and shape of the cover 10 may be as large or small as desired depending upon the electronic component to which it is intended to be attached. As the size of the cover 10 increases, the thickness of the body 12 may be increased to afford added support. The bottom surface 15 is configured to enclose (and may optionally fit against) an electronic component 19. The body 12 includes two side flanges 22 that may be formed integral with the body 12, curve downward away from the top surface 14 and extend in a direction generally perpendicular to the top surface 14. The side flanges 22 are provided along a majority of the length of the side edges 18. The side flanges 22 are located opposite from each other on the body 12. The side flanges 22 are configured to enclose the side walls 23 of an electronic component 19 secured to the cover 10.

The cover 10 includes four end flanges 24. The end flanges 24 may be formed integral with the body 12, curve downward away from the top surface 14, and extend in a direction generally perpendicular to the top 14. The end flanges 24 are positioned at opposite ends of the body 12 and are generally perpendicular to the side flanges 22. The end flanges 24 extend across portions of the end edges 20, but do not extend to the corners 21 where the end edges 20 and side edges 18 interconnect. Preferably, a set of two end flanges 24 is situated on each end edge 20. The end flanges 24 are configured to enclose the end walls 25 of an electronic component 19 secured to the cover 10.

The cover 10 includes an alignment dimple 26 that is a slight protrusion in the top surface 14 of the body 12 to facilitate the correct alignment of the electronic component 19 secured to the cover 10 and a motherboard (not shown) when the cover 10 and tool 17 are used to position the electrical component 19 on a motherboard.

The cover 10 includes two component retention members 28 formed with and extending generally perpendicularly downward from the end edges 20. While the illustrated component retention members 28 are located opposite one another on opposite ends of the cover 10, they may be positioned elsewhere. Optionally, only one or more than two component retention members 28 may be used. Each opposing component retention member 28 is situated between a set of two end flanges 24 along one of the end edges 20. The component retention members 28 secure the electronic component 19 to the cover 10.

Figure 2:
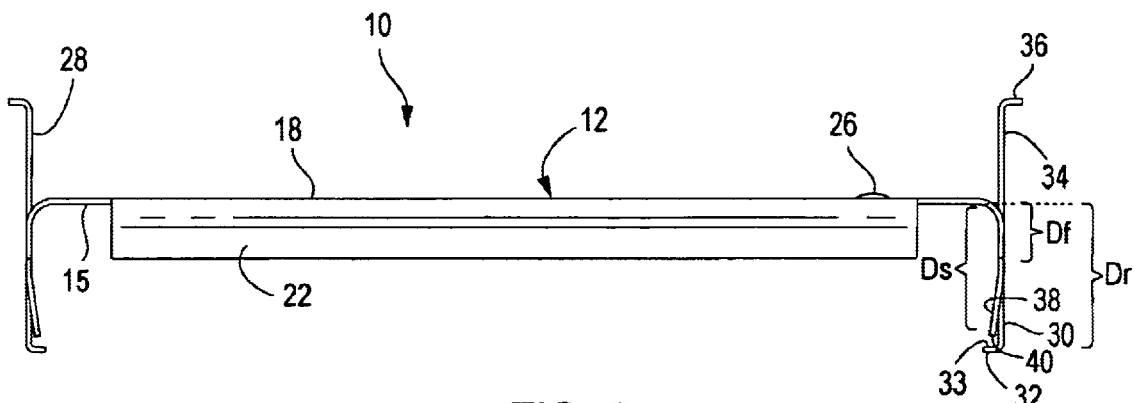
FIG. 2 illustrates a side view of the component retention member of FIG. 1.
Figure 3:
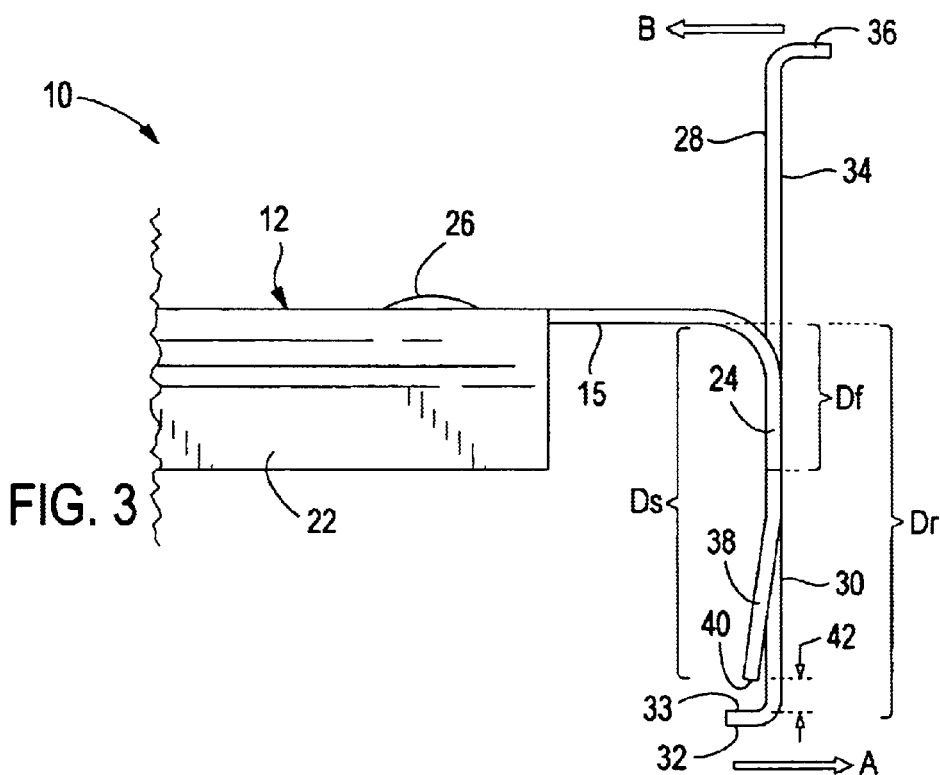
FIG. 3 illustrates a side view of an enlarged end portion of the component retention member of FIG. 2.

FIGS. 2 and 3 illustrate a side view of the cover 10 and the component retention member 28 in more detail. The cover 10 includes two rectangular release arms 30. The release arms 30 are formed with, and curve downward away from, the body 12 in a direction generally perpendicular to the body 12 similarly to the end flanges 24. The release arms 30 extend a distance Dr downward from the bottom surface 15, while the end and side flanges 24 and 22 extend a distance Df downward from the bottom surface 15. Each release arm 30 is positioned in the center of one of the end edges 20 between two end flanges 24 and located opposite another release arm 30. The release arms 30 are normally biased to a position (as shown in FIGS. 2 and 3) generally perpendicular (or at a slight acute angle) to the bottom surface 15 of the body 12. Alternatively, the release arms 30 may normally rest at an acute or obtuse angle to the bottom surface 15 depending upon the contour of the electronic component 19. The release arm 30 shown in FIG. 3 is deflectable in the direction of arrow A away from the body 12 when the electronic component 19 (FIG. 1) is being attached to the cover 10 or released from the cover 10. Each release arm 30 includes at least one hook-shaped catch 32 that is formed on a lower end of the release arm 30. The catches 32 bend inward toward one another and have catch surfaces 33 that extend generally parallel to the bottom surface 15. Each catch 32 may be oriented opposite another catch 32 across the body 12. The catches 32 are configured to encase the electronic component 19 when the release arms 30 return to their normally undeflected position thereby enclosing the electronic component 19.

The cover 10 also includes two generally rectangular release levers 34 that are formed integral with, and extend upward from, the release arms 30 to a point above the top surface 14. The release levers 34 are oriented opposite each other across the body 12. The release levers 34 shown in FIG. 3 is deflectable in the direction of arrow B. When one or both of the release levers 34 are deflected toward each other, the corresponding release arms 30 are deflected away from each other in order that the electronic component 19 may be positioned between the release arms 30 or released from the cover 10. The release levers 34 include rectangular grip aids 36 that are formed with the release levers 34 and curve out at the top of the release levers 34 in a direction away from the body 12. The grip aids 36 improve the grip of the operator on the release levers 34 when the operator deflects the release levers 34. As illustrated in FIGS. 2 and 3, the release levers 34 normally rest in a position generally perpendicular to the body 12. The release levers 34 are oriented to lie in the same plane as the release arms 30. Alternatively, the release levers 34 may be angled to normally lie at an acute or obtuse angle to the release arms 30.

The cover 10 includes rectangular stop beams 38 that are formed integral with and extend downward from the end flanges 24. The end flanges 24 slightly deflect in toward the bottom surface 15. The stop beams 38 may be positioned on both sides of the release arms 30 and release levers 34. The stop beams 38 include securing ends 40 spaced a distance Ds below the bottom surface 15. The stop beams 38 are located on opposite ends of the body 12. The stop beams 38 ensure that an electronic component 19 is not positioned any closer to the bottom surface 15 than the vertical distance Ds. The stop beams 38 and the release arms 30 define a vertical extend 42 there between that is measured as the distance between the catches 32 and the securing ends 40. The electronic component 19 is positioned within the vertical extent 42 when the electronic component is secured under the cover 10.

Each stop beam 38 extends in a direction forming an acute angle with a plane of a corresponding release arm 30. The stop beams 38 may be flexed slightly with respect to the release arms 30. The securing ends 40 of the stop beams 38 continue to engage the top of an electronic component 19 even when the release arms 30 are deflected away from each other to retain the electronic component 19 away from the body 12.

An operator or automatic tool 17 (FIG. 1) may secure the cover 10 to the electronic component 19 by applying pressure, causing the release levers 34 to deflect inward toward each other and toward the body 12. As the release levers 34 are deflected inward, the release arms 30 are deflected away from each other and the body 12. When the release arms 30 are deflected away from each other, the electronic component 19 may be positioned under the cover 10 with the sides of the electronic component 19 aligned with the side flanges 22 until the top of the electronic component 19 abuts against the securing ends 40 of the stop beams 38. When the operator releases the pressure on the release levers 34, the release levers 34 are returned to their unbiased positions generally perpendicular to the top surface 14. As the release levers 34 are moved back to unbiased positions, the release arms 30 are likewise moved back to unbiased positions perpendicular to the top surface 14. As the release arms 30 are returned to unbiased positions, the catches 32 extending from the release arms 30 slide under the electronic component 19. When the release levers 34 and release arms 30 are completely returned to their normal resting positions, the electronic component 19 is held between the securing ends 40 and the catches 32 within the vertical extent 42. The electronic component 19 is also pinched end-wise between the release arms 30. The electronic component 19 is thus secured to the cover 10. The securing ends 40, catches 32, and release arms 30 contact a very small portion of the electronic component 19.

The tool 17 may then be used to form a vacuum with the top surface 14 of the cover 10. The cover 10 and electronic component 19 may then be transported by use of the tool 17 to another structure, such as a motherboard, where the electronic component 19 is soldered to the motherboard. The electronic component 19 may be released from the cover 10 by applying pressure to the release levers 34 so that the release arms 30 are deflected outward away from the electronic component 19. As the release arms 30 are deflected away from the electronic component 19, the catches 32 move out from under and release the electronic component 19.

Figure 4:
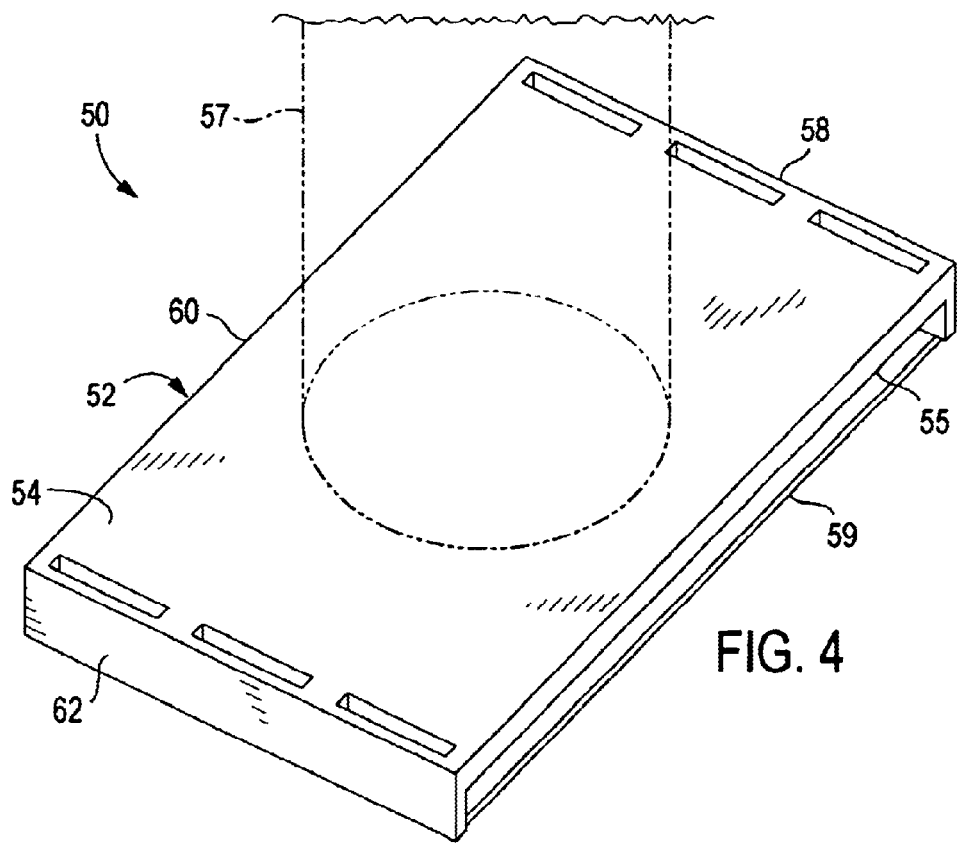
FIG. 4 illustrates an isometric view of a cover for an electronic component formed in accordance with an alternative embodiment of the present invention.

FIG. 4 illustrates an isometric view of an electronic component cover 50 formed in accordance with an alternative embodiment of the present invention. The cover 50 includes a body 52 that is generally of a uniform rectangular planar shape. The body 52 includes a top surface 54, a bottom surface 55, end edges 58, and side edges 60. The body 52 is formed of a rigid material to enable and facilitate the formation of a vacuum seal between a socket manipulating tool (generally denoted by dashed lines 57) and the top surface 54. Optionally, only the portion of the top surface 54 adapted to engage the tool 57 may be planar, while the remainder of the top surface 54 may be contoured. The bottom surface 55 is configured to be located over and enclose an electronic component 59.

The cover 50 includes two component retention members 62 formed with and extending generally perpendicularly downward from the end edges 58. While the illustrated component retention members 62 are located opposite one another on opposite ends of the cover 50, they may be positioned elsewhere. Optionally, only one or more than two component retention members 62 may be used. The component retention members 62 secure the electronic component 59 to the cover 50.

Figure 5:
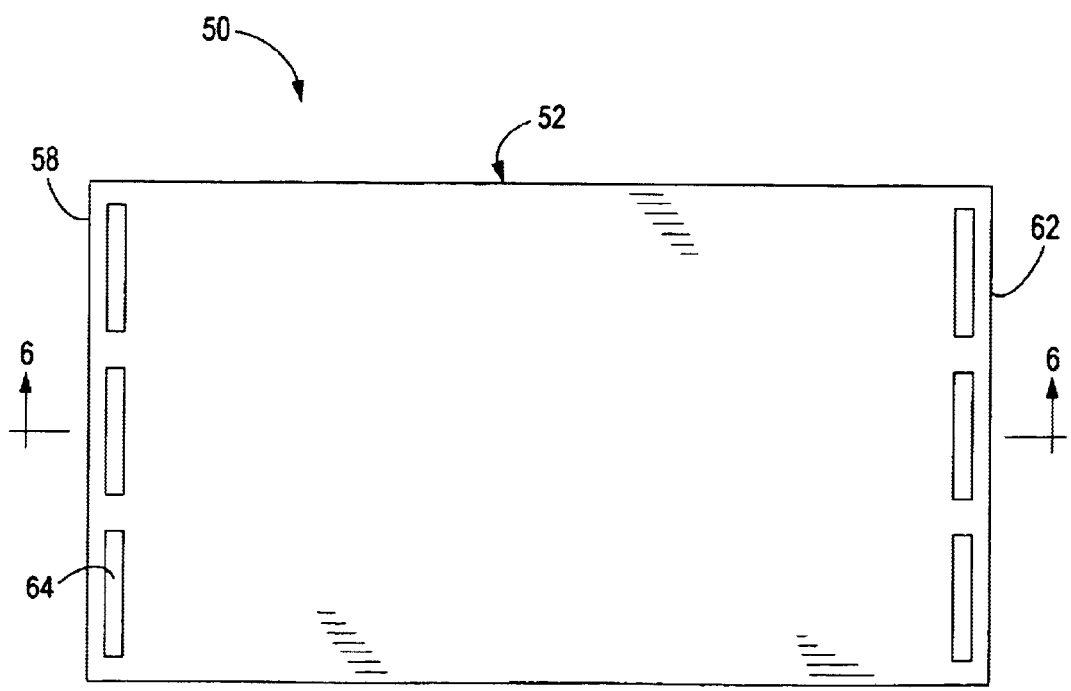
FIG. 5 illustrates a top plan view of the cover shown in FIG. 4.

FIG. 5 illustrates a top plan view of the cover 50 of FIG. 4. The body 52 includes generally narrow rectangular apertures 64 positioned along each of the end edges 58 where the component retention members 62 meet the body 52. The apertures 64 are oriented in a row alongside each end edge 58, and the opposed sets of apertures 64 are located opposite each other across the body 52. The apertures 64 are used when molding the cover 50.

Figure 6:
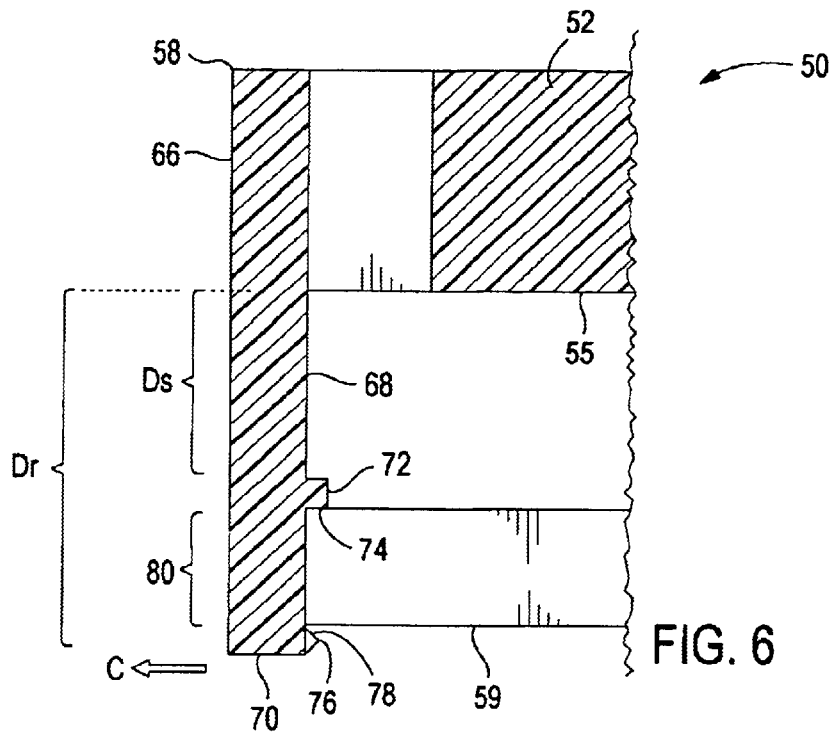
FIG. 6 illustrates a cutaway view of an end section of the cover of FIG. 5 taken along section line 6—6 in FIG. 5.

FIG. 6 illustrates a cutaway view of an end section of the cover 50 of FIG. 5 taken along section line 6—6 in FIG. 5. The cover 50 includes similar structure on both ends. As shown in FIG. 6, a generally rectangular release arm 66 is formed with and extends downward from the end edge 58 away from the body 52 and oriented opposite the other release arm 66 and positioned generally perpendicular to the body 52. The release arm 66 shown in FIG. 6 is deflectable in the direction of arrow C away from the other release arm 66 so that the release arms 66 may be manipulated to enclose or release the electronic component 59. Each release arm 66 includes an interior side 68 that faces in the direction of the opposing release arm 66 and a bottom side 70 that faces downward away from the bottom surface 55.

Each release arm 66 includes a rectangular stop projection 72 that is formed with and extends inward from the interior side 68. Each stop projection 72 includes a securing surface 74 facing downward away from the bottom surface 55. The stop projections 72 prevent the electronic component 59 from contacting the bottom surface 55 by spacing the electronic component 59 a distance Ds from the bottom surface 55. The stop projections 72 also are configured to secure the top of the electronic component 59 when the release arms 66 remain in an undeflected position and retain the electronic component 59 under the body 52.

Each release beam 66 also includes a wedge-shaped catch 76 formed with and extending generally inward from the interior side 68. The catches 76 are located proximate the bottom end 70 of each release arm 66. The catches 76 are located a distance Dr below the bottom surface 55. Each catch 76 includes a securing topside 78 forming an obtuse angle with the interior side 68 of the release arm 66 and generally facing toward the bottom surface 55. The catches 76 are configured to engage the underside of the electronic component 59 when the release arms 66 are in an undeflected position and retain the electronic component 59 under the body 52. The electronic component 19 is held in a gap 80 between the catches 76 and the stop projections 72.

An operator or automatic tool 57 (FIG. 4) may secure the cover 50 to an electronic component 59 by positioning the cover 50 over, and pressing downward onto, the electronic component 59 so that the release arms 66 press against the electronic component 59 and are deflected away from each other. As the release arms 66 are deflected, the catches 76 slide under the electronic component 59 so that the electronic component 59 is held against the securing surfaces 74 of the stop projections 72 between the catches 76 and the stop projections 72 within the gap 80. The securing surfaces 74, catches 76, and release arms 66 contact a very small portion of the electronic component 59.

The tool 57 (FIG. 4) may then be used to form a vacuum with the top surface 54 of the cover 50. The cover 50 and the electronic component 59 may then be transported by use of the tool 57 to another structure, such as a motherboard, where the electronic component 59 is soldered to the motherboard. The electronic component 59 may be released from the cover 50 by pulling the cover 50 away from the electronic component 59 causing the catches 76 to slide out from under the electronic component 59 and the release arms 66 to be deflected outward away from each other and away from the electronic component 59. As the release arms 30 are deflected away from the electronic component 59 and the catches 76 move out from under and the electronic component 59, the electronic component 59 is released.

Figure 7:
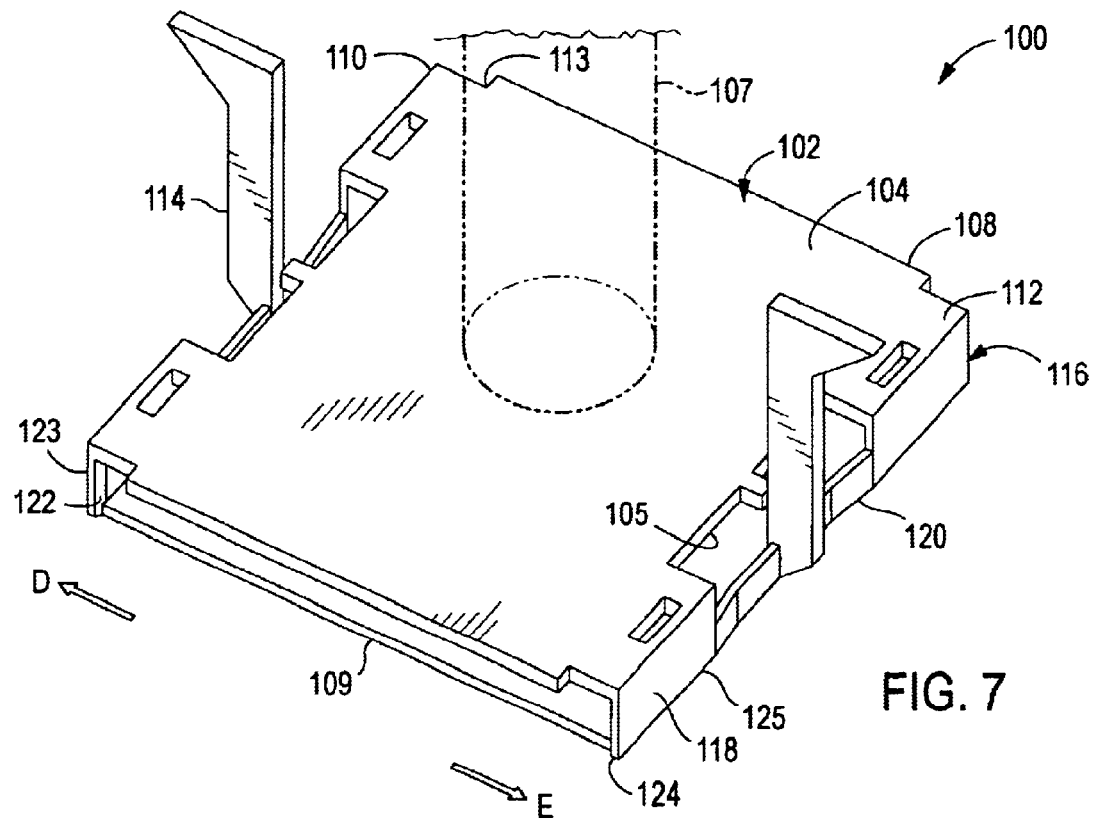
FIG. 7 illustrates an isometric view of a cover for an electronic component formed in accordance with an alternative embodiment of the present invention.

FIG. 7 illustrates an isometric view of an electronic component cover 100 formed in accordance with an alternative embodiment of the present invention. The cover 100 includes a body 102 that is generally of a uniform rectangular planar shape. The body 102 includes a top surface 104, a bottom surface 105, end edges 108, and side edges 110. The body 102 is formed of a rigid material to enable and facilitate the formation of a vacuum seal between a socket manipulating tool (generally denoted by dashed lines 107) and the top surface 104. Optionally, only the portion of the top surface 104 adapted to engage the tool 107 may be planar, while the remainder of the top surface 104 may be contoured. The bottom surface 105 is configured to be located over and enclose an electronic component 109.

The cover 100 includes four rectangular support ledges 112 and two component retention members 114. The support ledges 112 are formed integral with and extend from the side edges 110 along the top surface 104. The support ledges 112 extend across portions of the side edges 110, but do not extend to the corners 113 where the side edges 110 and end edges 108 interconnect. Preferably, a set of two support ledges 112 is situated on each side edge 110. The support ledges 112 support the component retention members 114.

The component retention members 114 are formed with, and extend generally perpendicularly downward from, the two support ledges 112. While the illustrated component retention members 114 are located opposite one another on opposite ends of the cover 100, they may be positioned elsewhere. Optionally, only one or more than two component retention members 114 may be used. The component retention members 114 secure the electronic component 109 to the cover 100.

The cover 100 includes two release arms 116 having generally rectangular wall segments 118 connected together by bowed, generally rectangular retention strips 120. The release arms 116 are formed with, and extend downward away from, the support ledges 112 in a direction generally perpendicular to the support ledges 112. The release arms 116 are located opposite each other. The retention strips 120 curve inward toward the side edges 110. The release arms 116 are normally biased to a position (as shown in FIG. 7) generally perpendicular (or at a slight acute angle) to the bottom surface 105 of the body 102. Alternatively, the release arms may normally rest at an acute or obtuse angle to the bottom surface 105 depending upon the contour of the electronic component 109. The left release arm 123 is deflectable in the direction of arrow D away from the body 102 and the right release arm 125 is deflectable in the direction of arrow E away from the body 152 when the electronic component 109 is being attached to the cover 100 or released from the cover 100. The retention strips 120 frictionally engage and retain an electronic component 109 positioned between the release arms 116. The release arms 116 include interior sides 122 that face toward each other and bottom sides 124 that face in the direction downward away from the bottom surface 105.

Figure 8:
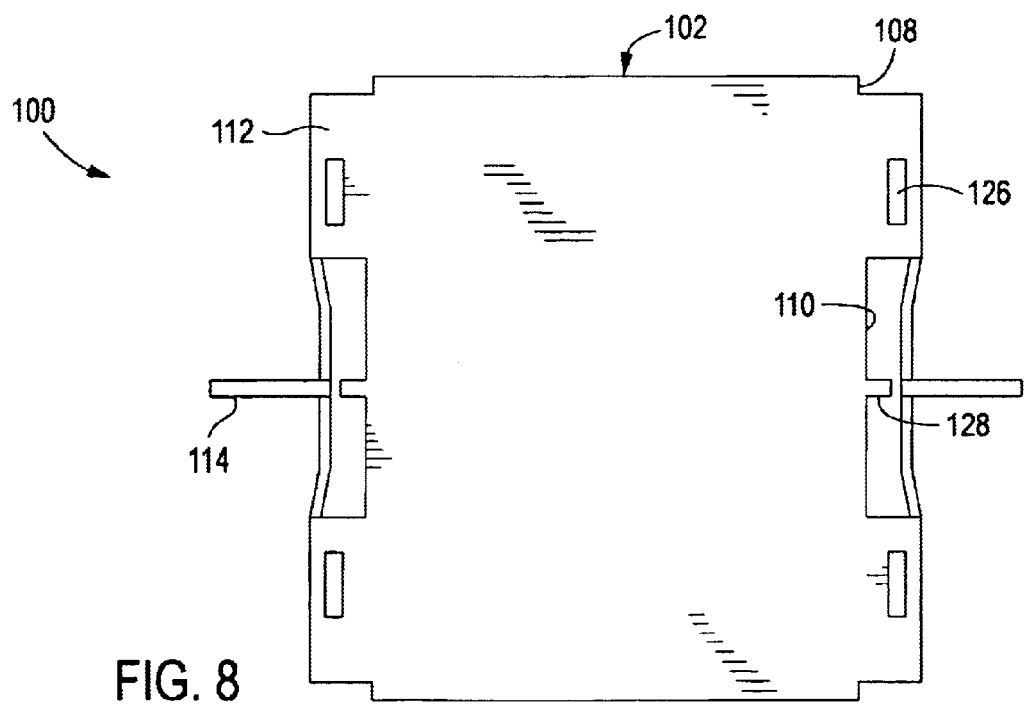
FIG. 8 illustrates a top plan view of the cover of FIG. 7.

FIG. 8 illustrates a top plan view of the cover 100 of FIG. 7. The support ledges 112 include generally rectangular molding apertures 126. The molding apertures 126 are oriented in a row alongside each side edge 108, and the opposed sets of molding apertures 126 are located opposite each other across the body 102. The molding apertures 126 are used when molding the cover 100. The body 102 includes two square component retention member rests 128 that are formed with and extend from the side edge 110 away from the body 102. The component retention member rests 128 are positioned between the support ledges 112 on the side edges 110 opposite each other. The component retention member rests 128 prevent the component retention members 114 from being deflected toward the side edges 110 so that the component retention members 114 contact the side edges 110. Also, the component retention members 114 are pivoted about the component retention member rests 128 when the component retention members 114 are deflected toward each other.

Figure 9:
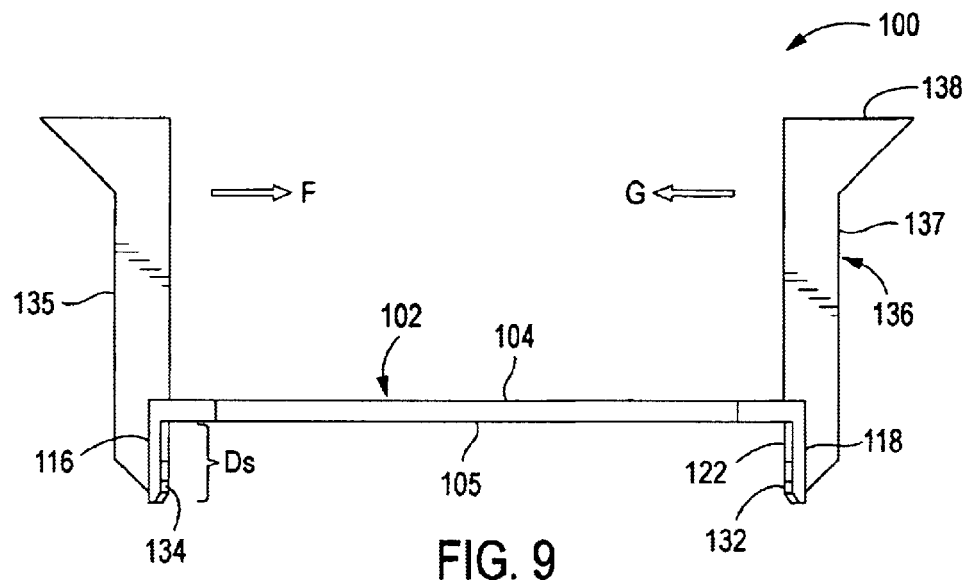
FIG. 9 illustrates a side section view of the component retention members of FIG. 7 in greater detail.

FIG. 9 illustrates a side view of the component retention members 114 of FIG. 7 in greater detail. Each release arm 116 includes two rectangular stop projections 132 that are formed with, and extend inward from, the interior sides 122 of the wall segments 118. Each stop projection 114 includes a securing surface 134 facing downward away from the bottom surface 105. The stop projections 132 prevent the electronic component 109 (FIG. 7) from contacting the bottom surface 105 by spacing the electronic component 109 a distance Ds from the bottom surface 105. The stop projections 132 also are configured to secure the top of the electronic component 109 when the release arms 116 remain in an undeflected position and retain the electronic component 109 under the body 102.

The cover 100 includes two generally rectangular release levers 136 that are formed integral with, and extend upward from, the release arms 116 to a point above the top surface 104. The release levers 136 are oriented opposite each other across the body 102. The left release lever 135 is deflectable in the direction of arrow F toward the body 102 and the right release lever 137 is deflectable in the direction of arrow G toward the body 102, but the release levers 136 may only be deflected to the point where the release levers 136 engage the component retention member rests 128 (FIG. 8). When one or both of the release levers 136 are deflected toward each other, the corresponding release arms 116 are deflected in the direction of their respective arrows in order that the electronic component 109 may be positioned between the release arms 116 or released from the cover 100. The release levers 136 include triangular grip aids 138 formed with the release levers 136 and that extend out at the top of the release levers 136 in a direction away from the body 102. The grip aids 138 improve the grip of the operator on the release levers 136 when the operator deflects the release levers 136. As illustrated in FIG. 9, the release levers 136 normally rest in a position generally perpendicular to the body 102. The release levers 136 are oriented to lie in the same plane as the release arms 116. Alternatively, the release levers 136 may be angled to normally lie at an acute or obtuse angle to the release arms 116.

Unlike the previous embodiments, the cover 100 of FIGS. 7–9 does not include catches positioned on the interior sides 122 of the release arms 116. The cover 100 retains the electronic component 109 by holding the electronic component 109 under the securing surfaces 134 of the stop projections 132 and between the release arms 116. The stop projections 132 prevent the electronic component 109 from being positioned closer to the bottom surface 105 than the vertical distance Ds between the securing surfaces 134 and the bottom surface 105. The release arms 116 frictionally engage the electronic component 109 and secure the electronic component 109 to the cover 100.

An operator or automatic tool 107 may secure the cover 100 to the electronic component 109 by applying pressure in the direction of arrow F to the left release lever 135 and in the direction of arrow G to the right release lever 137, causing the release levers 136 to deflect inward toward each other and toward the body 102. As the release levers 136 are deflected inward, the left release arm 123 is deflected in the direction of arrow D and the right release arm 125 is deflected in the direction of arrow E. When the release arms 116 are deflected away from each other, the electronic component 109 may be positioned under the cover 100 until the top of the electronic component 109 abuts against the securing surfaces 134 of the stop projections 132. When the operator releases the pressure on the release levers 136, the release levers 136 are returned to their unbiased positions generally perpendicular to the top surface 104. As the release levers 136 are moved back to unbiased positions, the release arms 116 likewise are moved back to unbiased positions perpendicular to the top surface 104. As the release arms 116 are returned to unbiased positions, the release arms 116 frictionally engage the sides of the electronic component 109, securing the electronic component 109 between the release arms 116. When the release levers 136 and release arms 116 are completely returned to their normal resting positions, the electronic component 109 is held against the securing surfaces 134 of the stop projections 132 and the electronic component is pinched end-wise between the release arms 116. The electronic component 109 is thus secured to the cover 100. The securing surfaces 134 and release arms 116 contact a very small portion of the electronic component 109.

The tool 107 may then be used to form a vacuum with the top surface 104 of the cover 100. The cover 100 and electronic component 109 may then be transported by use of the tool 107 to another structure, such as motherboard, where the electronic component 109 is soldered to the motherboard. The electronic component 109 may be released from the cover 100 by applying pressure to the release levers 136 so that the release arms 116 are deflected outward away from the electronic component 109. As the release arms 136 are deflected away from the electronic component 109, the release arms 116 no longer contact the electronic component 109, and the electronic component 109 is released.

Figure 10:
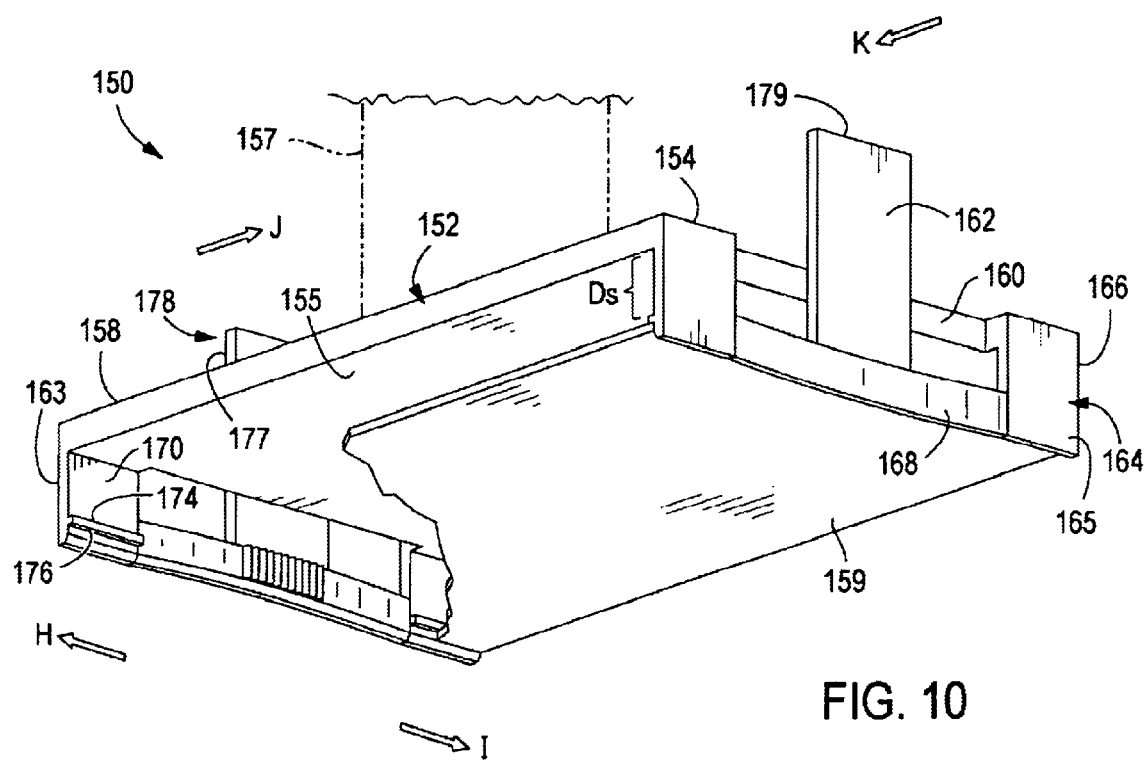
FIG. 10 illustrates a bottom isometric view of a cover for an electronic component formed in accordance with an alternative embodiment of the present invention.

FIG. 10 illustrates a bottom isometric view of an electronic component cover 150 formed in accordance with an alternative embodiment of the present invention. The cover 150 includes a body 152 that is generally of a uniform rectangular planar shape. The body 152 includes a top surface 154, a bottom surface 155, end edges 158, and side edges 160. The body 152 is formed of a rigid material to enable and facilitate the formation of a vacuum seal between a socket manipulating tool (generally denoted by dashed lines 157) and the top surface 154. Optionally, only the portion of the top surface 154 adapted to engage the tool 157 may be planar, while the remainder of the top surface 154 may be contoured. The bottom surface 155 is configured to be located over and enclose an electronic component 159.

The cover 150 includes two component retention members 162. The component retention members 162 are formed with and extend generally perpendicularly downward from the two side edges 160. While the illustrated component retention members 162 are located opposite one another on opposite ends of the cover 150, they may be positioned elsewhere. Optionally, only one or more than two component retention members 162 may be used. The component retention members 162 secure the electronic component 159 to the cover 150.

The cover 150 includes two release arms 164 comprising generally rectangular wall segments 166 connected together by thin, bowed, generally rectangular retention strips 168. The release arms 164 are formed with and extend downward away from the side edges 160 in a direction generally perpendicular to the body 152. The release arms 164 are located opposite each other. The retention strips 168 curve inward toward the side edges 160. The release arms 164 are normally biased to a position (as shown in FIG. 10) generally perpendicular (or at a slight acute angle) to the bottom surface 155 of the body 152. Alternatively, the release arms 164 may normally rest at an acute or obtuse angle to the bottom surface 155 depending upon the contour of the electronic component 159. The left release arm 163 is deflectable in the direction of arrow H away from the body 152 and the right release arm 165 is deflectable in the direction of arrow I away from the body 152 when the electronic component 159 is being attached to the cover 150 or released from the cover 150. The retention strips 168 frictionally engage and retain an electronic component 159 positioned between the release arms 164.

Each release arm 164 includes two rectangular stop projections 174 that are formed integral with, and extend inward from, the interior sides 170 of the wall segments 166. Each stop projection 174 includes a securing surface 176 facing downward away from the bottom surface 155. The stop projections 174 prevent the electronic component 159 from contacting the bottom surface 155 by spacing the electronic component 159 a distance Ds from the bottom surface 155. The stop projections 174 also are configured to secure the top of the electronic component 159 when the release arms 164 remain in an undeflected position and retain the electronic component 159 under the body 152.

The cover 150 also includes two rectangular release levers 178 that are formed integral with, and extend upward from, the rectangular retention strips 168 of the release arms 164 to a point above the top surface 154. The release levers 178 are oriented opposite each other across the body 152. The left release lever 177 is deflectable in the direction of arrow J toward the body 152 and the right release lever 179 is deflectable in the direction of arrow K toward the body 152. When one or both of the release levers 178 are deflected toward each other, the corresponding release arms 164 are deflected in the direction of their respective arrows H and I in order that the electronic component 159 may be positioned between the release arms 164 or released from the cover 150. As illustrated in FIG. 10, the release levers 178 normally rest in a position generally perpendicular to the body 152. The release levers 178 are oriented to lie in the same plane as the release arms 164. Alternatively, the release levers 178 may be angled to normally lie at an acute or obtuse angle to the release arms 164.

Figure 11:
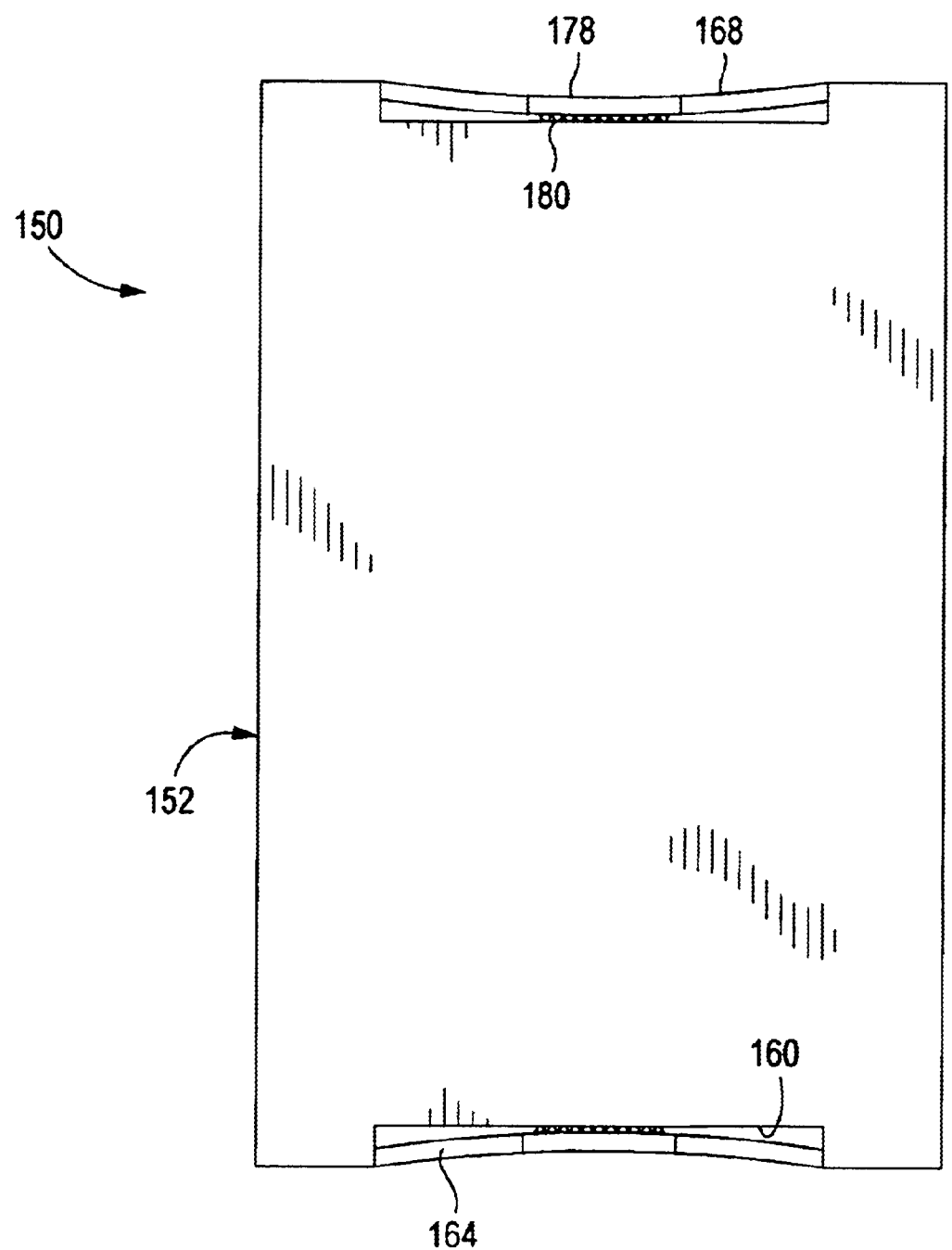
FIG. 11 illustrates a top plan view of the cover of FIG. 10 in more detail.

FIG. 11 illustrates a top plan view of the cover 150 of FIG. 10 in more detail. The retention strips 168 curve inward toward each other. The retention strips 168 include gripping teeth 180 that are formed with, and extend inward from, the interior sides 170 of the retention strips 168. The retention strip 168 and gripping teeth 180 retain the electronic component 159 (FIG. 10) by frictionally engaging the electronic component 159 when the electronic component 159 is positioned between the release arms 164. Additionally, the release levers 178 are deflectable toward the body 152 only to the point where the release levers 178 contact the side edges 160.

Like the previous embodiment shown in FIGS. 7–9, the cover 150 of FIGS. 10–11 does not include catches positioned on the interior sides 170 of the release arms 164. The cover 150 retains the electronic component 159 by holding the electronic component 159 under the securing undersides 176 of the stop projections 174 and between the grip teeth 180 of the release arms 164. The stop projections 174 prevent the electronic component 159 from being positioned closer to the bottom surface 155 than the vertical distance Ds between the securing surfaces 176 and the bottom surface 155. The gripping teeth 180 of the release arms 164 frictionally engage the electronic component 159 and secure the electronic component 159 to the cover 150.

An operator or automatic tool 157 may secure the cover 150 to the electronic component 159 by applying pressure in the direction of arrow J to the left release lever 177 and in the direction of arrow K to the right release lever 179, causing the release levers 178 to deflect inward toward each other and toward the body 152. As the release levers 178 are deflected inward, the left release arm 163 is deflected in the direction of arrow H and the right release arm 165 is deflected in the direction of arrow I. When the release arms 164 are deflected away from each other, the electronic component 159 may be positioned under the cover 150 until the top of the electronic component 159 abuts against the securing surfaces 176 of the stop projections 174. When the operator releases the pressure on the release levers 178, the release levers 178 are returned to their unbiased positions generally perpendicular to the top surface 154. As the release levers 178 are moved back to unbiased positions, the release arms 164 likewise are moved back to unbiased positions perpendicular to the top surface 154. As the release arms 164 are returned to unbiased positions, the gripping teeth 180 of the release arms 164 encounter and frictionally engage the electronic component 159, catching and securing the electronic component 159 between the release arms 164. When the release levers 178 and release arms 164 are completely returned to their normal resting positions, the electronic component 159 is held against the securing surfaces 176 of the stop projections 174 and the electronic component 159 is pinched endwise between the release arms 164. The electronic component 159 is thus secured to the cover 150. The securing surfaces 176 and release arms 164 contact a very small portion of the substrate.

The tool 157 may then be used to form a vacuum with the top surface 154 of the cover 150. The cover 150 and the electronic component 159 may then be transported by use of the tool 157 to another structure, such as a motherboard, where the electronic component 159 is soldered to the motherboard. The electronic component 159 may be released from the cover 150 by applying pressure to the release levers 178 so that the release arms 164 are deflected outward away from the electronic component 159 and the electronic component 159 is released.

The cover of certain embodiments of the present invention greatly improves a manufacturer's ability to handle and transport an electronic component. First, the top surface of the cover serves as a flat, rigid surface that may be used in conjunction with a tool so as to create a vacuum between the top surface and the tool. The tool then may be used to conveniently transport the cover and the electronic component so that the electronic component is not touched anywhere but on a body by component retention members. By allowing the use of a vacuum tool for transporting the electronic component and minimizing the contact of the electronic component with other entities during transportation, the cover significantly reduces the risk of the electronic component being damaged. Secondly, because the component retention members only pinch the sides of the electronic component body and may be deflected away from the sides of the body, the component retention members do not have to be "snapped" on or off of the electronic component body. Therefore, the component retention members do not pull or press the electronic component so as to damage the component or anything attached to the component. Thus, the component retention members limit the chance of an electronic component being damaged during the process of attaching the cover to the electronic component or releasing the electronic component from the cover. Finally, the cover affords a significantly large surface area and prevents dust and other contaminants from compromising the integrity of the electronic component.

While the invention has been described with reference to a preferred embodiment, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A cover for an electrical component, comprising:
   an integrally formed body section having opposite peripheral edges, opposed end edges, and a planar top surface configured to form a vacuum seal with a tool for automatically assembling electrical components to other structures;
   said integrally formed body section including a flange provided along at least one of said peripheral edges, said flange preventing movement of an upper end of said electrical component relative to said body section in at least one direction parallel to said top surface; and
   said integrally formed body section including a release arm extending from at least one of said opposed end edges, said release arm configured to releasably retain said electrical component; and
   a stop beam extending from an end of said body section at an acute angle to said planar top surface, said stop beam being configured to engage said electrical component to hold said electrical component at a desired distance from said body section.

2. The cover of claim 1, wherein said release arm is normally biased toward said electrical component and detectable in in opposite direction away from said electrical component.

3. The cover of claim 1, wherein said release arm includes a catch surface configured to be secured to a bottom of said electrical component to retain said body section on said electrical component.

4. The cover of claim 1, wherein said release arm is oriented at a retention angle to, and extending downward from, said planar top surface, said release arm having a lever extending upward from said planar top surface, said release arm being deflectable from said retention angle to release said electrical component.

5. The cover of claim 1, wherein said release arm is formed with and bent downward from said body section, said release arm having a lower ledge bent inward to hold said electrical component when said release arm is in a normally biased position.

6. The cover of claim 1, wherein said release arm extends in a direction generally perpendicular to said body section and is normally biased to form an angle with said planar top surface that is no more than ninety degrees, said release arm being deflectable to form an obtuse angle with respect to said body section to release said electrical component.

7. The cover of claim 1, wherein said planar top surface is rigid to facilitate the formation of a vacuum seal.

8. A cover for an electrical component, comprising:
   an integrally formed body section having opposed end edges, opposed peripheral edges and a planar top surface extending between said peripheral edges, said top surface configured to form a vacuum seal with a tool for automatically assembling electrical components to other structures;
   said integrally formed body section including a release arm extending from at least one of said opposed end edges of said body section, said release arm configured to releasably retain said electrical component;
   a stop beam extending from an end of said body section at an acute angle said planar top surface, said stop beam being configured to engage said electrical component to hold said electrical component at a desired distance from said body section; and
   a release lever connected to said release arm, said release lever extending away from said electrical component and above said planar top surface.

9. The cover of claim 8, wherein said release arm is normally biased toward said electrical component and deflectable in an opposite direction away from said electrical component.

10. The cover of claim 8, wherein said release arm includes a catch surface configured to be secured to a bottom of said electrical component to retain said body section on said electrical component.

11. The cover of claim 8, wherein said release arm is oriented at a retention angle to and extending downward from said planar top surface, said release arm being deflectable from said retention angle to release said electrical component.

12. The cover of claim 8, wherein said release arm is formed with and bent downward from said body section, said release arm having a lower ledge bent inward to hold said electrical component when said release arm is in a normally biased position.

13. The cover of claim 8, wherein said release arm extends in a direction generally perpendicular to said body section and is normally biased to form an angle with said planar top surface that is no more than ninety degrees, said release arm being deflectable to form an obtuse angle with respect to said body section to release said electrical component.

14. The cover of claim 8, wherein said planar top surface is rigid to facilitate the formation of a vacuum seal.

* * * * *

UNITED STATES PATENT AND TRADEMARK OFFICE
CERTIFICATE OF CORRECTION

PATENT NO. : 6,927,339 B2  
APPLICATION NO. : 10/056615  
DATED : August 9, 2005  
INVENTOR(S) : Keith McQuilkin Murr et al.

Page 1 of 1

It is certified that error appears in the above-identified patent and that said Letters Patent is hereby corrected as shown below:

On the Title page item (75), "Alexander" Matthews should be changed to -- Alexandra -- Matthews.

Signed and Sealed this

Fifteenth Day of July, 2008

JON W. DUDAS  
*Director of the United States Patent and Trademark Office*